United States Patent
Muto et al.

(10) Patent No.: US 10,326,437 B2
(45) Date of Patent: Jun. 18, 2019

(54) CIRCUIT DEVICE AND ELECTRONIC APPARATUS

(71) Applicant: SEIKO EPSON CORPORATION, Tokyo (JP)

(72) Inventors: Kota Muto, Matsumoto (JP); Toshimichi Yamada, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/969,655

(22) Filed: May 2, 2018

(65) Prior Publication Data

US 2018/0351544 A1 Dec. 6, 2018

(30) Foreign Application Priority Data

May 31, 2017 (JP) ................................. 2017-107490

(51) Int. Cl.
*H03K 17/16* (2006.01)
*H03H 11/28* (2006.01)
*H04B 1/00* (2006.01)
*H04B 1/40* (2015.01)

(52) U.S. Cl.
CPC ............ *H03K 17/16* (2013.01); *H03H 11/28* (2013.01); *H04B 1/00* (2013.01); *H04B 1/40* (2013.01)

(58) Field of Classification Search
CPC ........... H03K 17/16; H03H 11/28; H04B 1/40
USPC ........................................................ 326/30
See application file for complete search history.

(56) References Cited

U.S. PATENT DOCUMENTS

| 5,578,944 | A | * | 11/1996 | Sasaki | H03K 19/017518 326/103 |
| 7,218,136 | B2 | | 5/2007 | Kasahara | |
| 7,573,298 | B2 | | 8/2009 | Sawada et al. | |
| 2005/0275425 | A1 | * | 12/2005 | Lee | H04L 25/0272 326/30 |
| 2009/0237109 | A1 | * | 9/2009 | Haig | H03K 19/0005 326/30 |
| 2010/0061005 | A1 | * | 3/2010 | Contreras | G11B 5/022 360/46 |
| 2011/0205832 | A1 | * | 8/2011 | Jeon | G11C 7/1057 365/233.16 |
| 2012/0262200 | A1 | * | 10/2012 | Shin | H03K 19/00315 326/30 |

FOREIGN PATENT DOCUMENTS

| JP | 2005-340945 A | 12/2005 |
| JP | 2007-174618 A | 7/2007 |

* cited by examiner

*Primary Examiner* — Don P Le
(74) *Attorney, Agent, or Firm* — Oliff PLC

(57) ABSTRACT

A circuit device includes: a transmitting circuit that performs transmission of a signal by current-driving signal lines in a transmission period; a receiving circuit that receives a signal that a transmitting circuit of a communication partner has transmitted by current-driving the signal lines, in a reception period that is different from the transmission period; and terminating resistor circuits that can be connected to the signal lines, and whose resistance value in the transmission period is set to a value that is smaller than a resistance value in the reception period.

14 Claims, 9 Drawing Sheets

| | CIRCUIT DEVICE | | EXTERNAL DEVICE | | SIGNAL AMPLITUDE |
|---|---|---|---|---|---|
| | RVP, RVN[Ω] | IQ[mA] | TERMINATING RESISTOR [Ω] | CURRENT[mA] | [mV] |
| DURING RECEPTION | 45 | – | 45 | 17.8 | 400 |
| SMALL RESISTANCE | 35 | 17.8 | 45 | – | 350 |
| SMALL RESISTANCE, LARGE CURRENT | 35 | 20.3 | 45 | – | 400 |

(DURING RECEPTION)

CIRCUIT DEVICE AND ELECTRONIC APPARATUS

BACKGROUND

1. Technical Field

The present invention relates to circuit devices, electronic apparatuses, and the like.

2. Related Art

Heretofore, a circuit device is known that realizes data transfer control of the USB (Universal-Serial-Bus). A known technology of such a circuit device includes a technology disclosed in U.S. Pat. No. 7,573,298.

A transmitting circuit that current-drives a first signal line and a second signal line that constitute a differential signal line is disclosed in U.S. Pat. No. 7,573,298. The transmitting circuit includes a constant current circuit that supplies a current to the first and second signal lines, a current control circuit that controls the current value of the current, a first terminating resistor circuit to be connected to the first signal line, and a second terminating resistor circuit to be connected to the second signal line. The current control circuit controls the current value of the current that the constant current circuit supplies to the first and second signal lines according to the resistance value of the first and second terminating resistor circuits.

With respect to the USB, an eye pattern is measured in the certification test. Therefore, the transmitting circuit for the HS mode of the USB needs to output a transmission signal that can pass the certification test of the USB standard with respect to the eye pattern. However, a parasitic capacitance and a parasitic resistance exist in the signal path of the transmission signal, and therefore a situation may arise in which passing the eye pattern certification test is difficult due to the parasitic capacitance and parasitic resistance.

A method is conceivable, as a method for improving the eye pattern during transmission, in which the eye pattern characteristics (such as a signal amplitude and a slope at rising or falling, for example) are adjusted by adjusting parameters (such as the resistance value of a terminating resistor and the current value of a constant current circuit, for example) of the transmitting circuit, for example. However, because a portion of the circuit (such as a terminating resistor, for example) is used for both transmission and reception, a situation arises in which, if the circuit parameters are optimized for transmission, an appropriate eye pattern cannot be realized in transmission and reception. For example, when the resistance value of the terminating resistor is reduced, the signal amplitude decreases in reception, and therefore a situation arises in which passing the USB standard certification test with respect to the eye pattern is not possible.

Note that the above-described problem is not limited to the USB, and it is possible that a similar problem may arise in serial communication in which a signal is transmitted through current-driving signal lines.

SUMMARY

According to some aspects of the invention, a circuit device, an electronic apparatus, and the like can be provided that can realize an appropriate eye pattern during transmission and reception.

One aspect of the invention relates to a circuit device that includes: a transmitting circuit that performs transmission of a signal by current-driving a signal line in a transmission period; a receiving circuit that receives a signal that a transmitting circuit of a communication partner has transmitted by current-driving the signal line, in a reception period that is different from the transmission period; and a terminating resistor circuit that can be connected to the signal line, and whose resistance value in the transmission period is set to a value that is smaller than a resistance value in the reception period.

According to one aspect of the invention, the resistance value of the terminating resistor circuit in the transmission period can be set to a resistance value that is smaller than the resistance value in the reception period. Accordingly, the signal quality of the transmission signal in the transmission period can be improved. Also, since the resistance value of the terminating resistor circuit is reduced in the transmission period, the influence of reducing the resistance value of the terminating resistor circuit in the transmission period can be reduced in the reception period in which a communication partner performs transmission. In this way, an appropriate eye pattern can be realized in the transmission period and in the reception period.

Also, in one aspect of the invention, the transmitting circuit may include: a constant current circuit that supplies a current to the signal line; and a control circuit that sets a current value of a constant current supplied by the constant current circuit to a current value in accordance with a resistance value of the terminating resistor circuit.

In one aspect of the invention, the resistance value of the terminating resistor circuit is changed between the reception period and the transmission period. The amplitude of the transmission signal changes according to the resistance value of the terminating resistor circuit. Therefore, it is possible that the amplitude of the transmission signal in the transmission period is not an appropriate amplitude. In this regard, according to one aspect of the invention, the constant current that the constant current circuit supplies to the signal line is set to a current value in accordance with the resistance value of the terminating resistor circuit. Therefore, the amplitude of the transmission signal can be adjusted to an appropriate amplitude in the transmission period.

Also, in one aspect of the invention, the current value of a current supplied by the constant current circuit and the resistance value of the terminating resistor circuit may be set such that a signal amplitude is in a range between a minimum amplitude and a maximum amplitude, in an eye pattern, that are defined in a serial communication standard of the signal line.

In this way, the resistance value of the terminating resistor circuit is reduced in the transmission period relative to that in the reception period, and as a result, the waveform of the transmission signal at rising and falling can be improved. Also, the signal amplitude, which decreases when the resistance value is reduced, can be adjusted to an appropriate amplitude by setting the current value of the constant current supplied by the constant current circuit.

Also, the configuration according to one aspect of the invention may be such that the transmitting circuit performs transmission of a signal by current-driving a first signal line and a second signal line, which constitute a differential signal line, as the signal line, the receiving circuit receives a signal that has been transmitted by a transmitting circuit of a communication partner current-driving the first signal line and the second signal line, a first terminating resistor circuit to be connected to the first signal line and a second terminating resistor circuit to be connected to the second signal line are provided as the terminating resistor circuit, and the first terminating resistor circuit and the second terminating resistor circuit can be set to have a resistance value such that the resistance value in the transmission period is smaller than the resistance value in the reception period.

In this way, one aspect of the invention can be applied to differential serial communication. Also, as a result of changing the resistance value of the first terminating resistor circuit to be connected to the first signal line and the second terminating resistor circuit to be connected to the second signal line between the reception period and the transmission period, an appropriate eye pattern can be realized.

Also, in one aspect of the invention, the circuit device may include: a first signal terminal for connection to the first signal line; and a second signal terminal for connection to the second signal line. The transmitting circuit may include: a constant current circuit that supplies a constant current to the first signal line and the second signal line; a first switch element provided between the first signal terminal and an output node of the constant current circuit; and a second switch element provided between the second signal terminal and the output node of the constant current circuit.

In this way, differential current-driving can be performed using the constant current supplied by the constant current circuit. Also, in one aspect of the invention, as a result of changing the current supplied by the constant current circuit and the resistance value of the first and second terminating resistor circuits between the reception period and the transmission period, an appropriate eye pattern can be realized with respect to a differential transmission signal.

Also, the configuration according to one aspect of the invention may be such that the circuit device further includes: a second transmitting circuit that performs transmission of a signal by voltage-driving the first signal line and the second signal line. In a first communication mode of a serial communication standard of the signal line, the transmitting circuit performs the transmission and the second transmitting circuit outputs a low potential side power supply voltage, and in a second communication mode of the serial communication standard, in which a data transfer rate is slower than that in the first communication mode, the second transmitting circuit performs the transmission. The first terminating resistor circuit is provided between the first signal terminal and a first output node of the second transmitting circuit, and the second terminating resistor circuit is provided between the second signal terminal and a second output node of the second transmitting circuit.

In this way, the resistors provided at the output nodes of the second transmitting circuit that transmits a signal in the second communication mode can also be used as the terminating resistor circuit in the first communication mode. Passing the certification test with respect to the eye pattern, in the first communication mode in which the data transfer rate is higher, is difficult relative to the second communication mode, but in the present embodiment, as a result of changing the resistance value of the terminating resistor circuit between the reception period and the transmission period, in the first communication mode, eye pattern characteristics can be improved.

Also, in one aspect of the invention, the resistance value of the terminating resistor circuit may be set to a resistance value that satisfies a serial communication standard of the signal line, in the reception period.

In the reception period, a communication partner transmits a transmission signal, and therefore the circuit device is unaware of what type of signal the communication partner will transmit (the circuit device cannot control the parameters of the transmitting circuit on the communication partner side). In one aspect of the invention, the resistance value of the terminating resistor circuit is adjustable, and the resistance value is set to a resistance value that satisfies the serial communication standard of the signal line in the reception period, and as a result, the transmission signal from the communication partner can be properly received.

Also, in one aspect of the invention, the circuit device may include a control circuit that sets the resistance value, of the terminating resistor circuit in the transmission period, to one of a resistance value out of a plurality of resistance values.

In this way, as a result of selecting one of the plurality of resistance values in the transmission period, the resistance value of the terminating resistor circuit can be changed between the reception period and the transmission period.

Also, in one aspect of the invention, the signal line may be a signal line conforming to a USB standard.

In this way, an appropriate eye pattern can be realized in the transmission period and in the reception period, in serial communication conforming to the USB standard.

Also, the configuration according to one aspect of the invention may be such that the circuit device further includes: a second transmitting circuit that performs transmission of a signal by voltage-driving the signal line. The transmitting circuit performs transmission in an HS mode, and the second transmitting circuit performs transmission in an FS mode, and the terminating resistor circuit can be set to have a resistance value such that the resistance value in the transmission period is smaller than the resistance value in the reception period, in the HS mode.

In the HS mode, the data transfer rate is higher than that in the FS mode, and therefore passing the certification test with respect to the eye pattern is difficult relative to the FS mode. In this regard, in one aspect of the invention, as a result of changing the resistance value of the terminating resistor circuit, in the HS mode, between the reception period and the transmission period, eye pattern characteristics in the HS mode can be improved.

Also, another aspect of the invention relates to an electronic apparatus according to any of the above descriptions.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes a preferable embodiment of the invention in detail. Note that the following embodiment is not intended to unreasonably limit the content of the invention that is described in the claims, and not all configurations that are described in the present embodiment are necessarily essential as solving means of the invention.

For example, although in the following, the USB will be described as an example of the serial communication standard, the invention is applicable to a serial communication standard in which a signal is transmitted through current-driving a signal line.

1. Circuit Device

Figure 1:
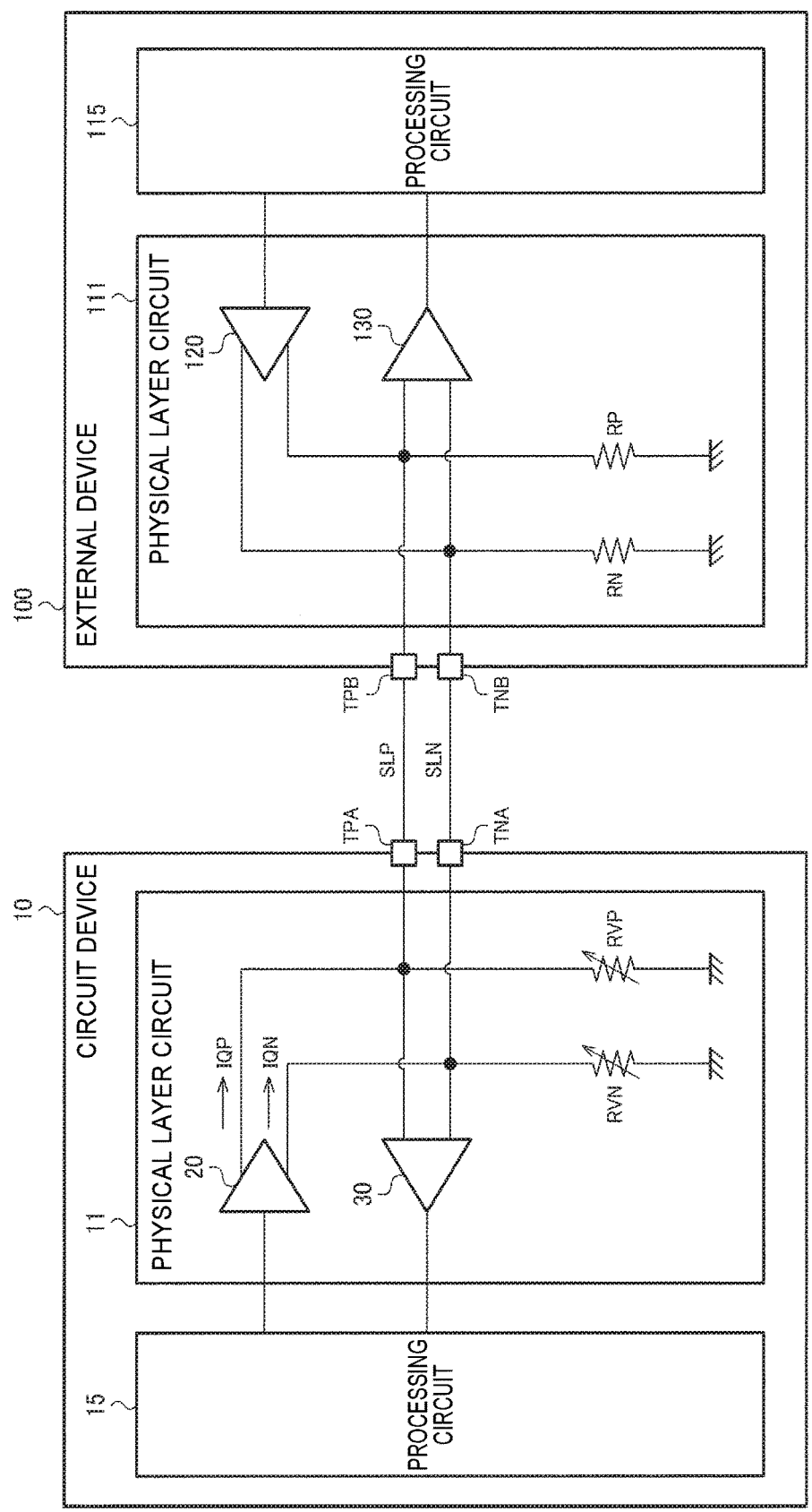
FIG. 1 is an exemplary configuration of a circuit device of a present embodiment.

FIG. 1 is an exemplary configuration of a circuit device of the present embodiment. The circuit device 10 in FIG. 1 includes a physical layer circuit 11 and a processing circuit 15. Also, the circuit device 10 may include signal terminals TPA and TNA. The physical layer circuit 11 includes a transmitting circuit 20 (transceiver), a receiving circuit 30 (receiver), and terminating resistor circuits RVN and RVP (variable resistance circuits). Note that the configuration of the circuit device is not limited to the configuration in FIG. 1, and various modifications can be implemented such as omitting some of the constituent elements, and adding another constituent element. For example, a case where a differential signal is transmitted and received is described in FIG. 1, as an example, but the target to which the invention is to be applied is not limited thereto, and the invention can be applied to a case where a single-end signal is transmitted and received.

The circuit device 10 is to be connected to an external device 100 via signal lines SLP and SLN that constitute a USB standard (serial communication standard) bus, and performs communication conforming to the USB standard via the signal lines SLP and SLN. The circuit device 10 is realized by an integrated circuit device, for example. The signal lines SLP and SLN are respectively connected between the signal terminals TPA and TNA of the circuit device 10 and signal terminals TPB and TNB of the external device 100. The signal terminals TPA and TNA are pads of a semiconductor chip, for example. The external device 100 is a device that transmits and receives a signal conforming to the USB standard, and includes a physical layer circuit 111 and a processing circuit 115. The physical layer circuit 111 includes a transmitting circuit 120, a receiving circuit 130, and terminating resistors RN and RP. The external device 100 is a main controller (host controller), a USB hub, a peripheral device, or the like, for example.

The physical layer circuit 11 is constituted by analog circuits in the physical layer. For example, the transmitting circuit 20, which is an HS (High Speed) transmitting circuit, and the receiving circuit 30 are analog circuits in the physical layer. Also, an FS (Full Speed) transmitting circuit, various types of detecting circuits, a pull-up resistor circuit, and the like may be included as the analog circuits in the physical layer. For example, circuits corresponding to a link layer and the like, of an USB transceiver macro cell, are included in the processing circuit 15, and analog circuits such as the transmitting circuit, the receiving circuit, and the detecting circuits are included in the physical layer circuit 11.

The processing circuit 15 is a circuit that performs various types of control processing, information processing, and the like, and can be realized by a logic circuit, which is designed using an automatic placement and routing method, such as a gate array. In the case where the circuit device 10 is applied to a USB hub, the configuration may be such that the circuit device 10 includes a second physical layer circuit, and the processing circuit 15 performs processing for transferring data between the physical layer circuit 11 and the second physical layer circuit. For example, the processing circuit 15 includes a serial/parallel conversion circuit that converts serial data received via the USB to parallel data, a parallel/serial conversion circuit that converts parallel data to serial data, and a circuit, corresponding to the link layer, such as an NRZI circuit. Note that the processing circuit 15 may be realized by a processor such as a CPU or an MPU.

The transmitting circuit 20 is a circuit that transmits a signal by current-driving the signal lines SLP and SLN in a transmission period. Specifically, the transmitting circuit 20 is a transmitting circuit of the HS mode of the USB standard, and outputs a current IQP to the signal line SLP (signal terminal TPA), and a current IQN to the signal line SLN (signal terminal TNA).

For example, when a positive differential signal (logic level "1") is output, the current IQP is output and the current IQN is set to zero, and when a negative differential signal (logic level "0") is output, the current IQN is output and the current IQP is set to zero. The current IQP is converted to a voltage by the terminating resistor circuit RVP of the circuit device 10 and the terminating resistor RP of the external device 100, and the voltage of the signal line SLP is expressed as IQP×RVP×RP/(RVP+RP). Similarly, the current IQN is converted to a voltage by the terminating resistor circuit RVN of the circuit device 10 and the terminating resistor RN of the external device 100, and the voltage of the signal line SLN is expressed as IQN×RVN×RN/(RVN+RN). The receiving circuit 130 of the external device 100 receives a signal through the voltages of the signal lines SLP and SLN.

The receiving circuit 30 is a circuit that receives a signal that has been transmitted by the transmitting circuit 120, of a communication partner, current-driving the signal lines SLP and SLN in a reception period that is different from the transmission period. The communication partner is a partner (partner connected to the signal lines SLP and SLN) with which the circuit device 10 performs communication conforming to the USB standard, and is the external device 100 in FIG. 1. Similarly to the transmitting circuit 20 of the circuit device 10, the currents that the transmitting circuit 120 outputs to the signal lines SLP and SLN are converted to voltages by the terminating resistors RP and RN of the external device 100 and the terminating resistor circuits RVP and RVN of the circuit device 10. The receiving circuit 30 receives a signal through these voltages.

The terminating resistor circuits RVP and RVN can be respectively connected to the signal lines SLP and SLN, and the resistance values thereof are variable. Specifically, one end of the terminating resistor circuit RVP is connected to the signal terminal TPA, and the other end is connected to a node at a low potential side power supply voltage (ground, for example). One end of the terminating resistor circuit RVN is connected to the signal terminal TNA, and the other end is connected to a node at the low potential side power supply voltage (ground, for example). Note that the other ends of the terminating resistor circuits RVP and RVN need not be directly connected to a low potential side power supply, and the configuration may be such that the other ends of the terminating resistor circuits RVP and RVN are connected to output nodes of a FS mode transmitting circuit, as will be described later, the transmitting circuit outputs the low potential side power supply voltage, and as a result, the other ends of the terminating resistor circuits RVP and RVN are indirectly connected to the low potential side power supply.

The terminating resistor circuits RVP and RVN are each set such that the resistance value in the transmission period (during transmission in which transmitting circuit 20 performs transmission) is smaller than the resistance value in the reception period (during reception in which receiving circuit 30 performs reception). Specifically, the resistance value of the terminating resistor circuits RVP and RVN is set to a first resistance value during transmission, and is set to a second resistance value during reception. The first resistance value can be set to one resistance value out of a plurality of settable resistance values, for example. The second resistance value is a fixed resistance value, for example. The fixed resistance value is a resistance value defined in the USB standard, for example. The settable plurality of resistance values that can be set as the first resistance value includes a resistance value that is smaller than the second resistance value, and as a result of setting the first resistance value to the resistance value, the first resistance value is set to a resistance value that is smaller than the second resistance value. For example, the first resistance value is a resistance value that is smaller than the resistance value of the terminating resistor defined in the USB standard.

Note that the first resistance value during transmission may be one (fixed) resistance value that is smaller than the second resistance value during reception. Also, in the case where one of a plurality of resistance values can be selected as the first resistance value, the plurality of resistance values may include a resistance value that is larger than the second resistance value during reception.

Figure 2:
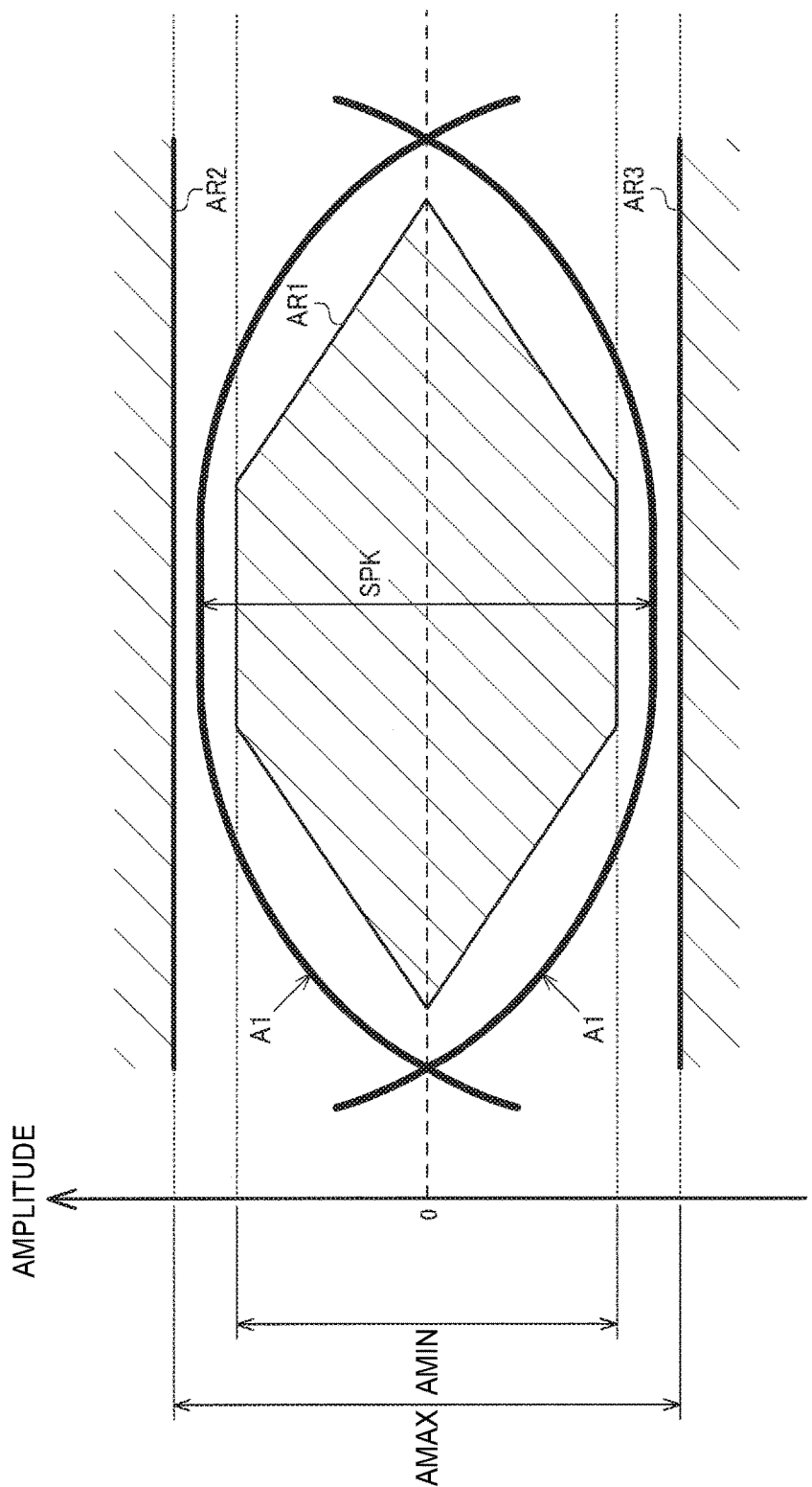
FIG. 2 is a diagram for describing an eye pattern in a certification test of the USB.

FIG. 2 is a diagram for describing an eye pattern in a certification test of the USB. AR1, AR2, and AR3 indicate inhibited regions of signal waveforms, and these inhibited regions AR1, AR2, and AR3 are defined in the USB standard. A transmitting circuit (HS) of the USB is required to be configured such that the waveforms of the transmission signals (DP and DM) indicated by A1 does not overlap the inhibited regions AR1, AR2, and AR3.

However, when the cable connected to the transmitting circuit is long, or a parasitic capacitance and the like are generated due to circuits (charging circuit, electrostatic protection circuit, short circuit protection circuit, and the like, for example) that are connected to the signal lines, for example, the signal quality of the transmission signal indicated by A1 is degraded. For example, a situation may arise in which the slope at rising (slope when the signal level changes from a low level to a high level) and the slope at falling (slope when the signal level changes from a high level to a low level) of the transmission signal are not steep, and the signal waveform overlaps the inhibited region AR1.

In this regard, according to the present embodiment, the resistance value of the terminating resistor circuits RVP and RVN during transmission can be set to a resistance value that is smaller than the resistance value during reception. Accordingly, the signal quality of the transmission signal can be improved. That is, as a result of reducing the resistance value of the terminating resistor circuits RVP and RVN, the slopes of the transmission signal at rising and falling can be made steep, and the waveform of the transmission signal does not overlap the inhibited region AR1.

Here, assume that the resistance value of the terminating resistor circuits RVP and RVN remains to be small during reception as well. When the circuit device 10 is to receive a signal, the external device 100 transmits the signal, and therefore the drive current is set on the external device 100 side. For example, the drive current is set to a current value obtained assuming that the resistance value of the terminating resistor circuits RVP and RVN is the same as the resistance value (resistance value defined in the USB standard, for example) during reception. Therefore, when the resistance value of the terminating resistor circuits RVP and RVN is small, the amplitude of the transmission signal decreases, and it is possible that the waveform will overlap the inhibited region AR1.

In this regard, according to the present embodiment, the resistance value of the terminating resistor circuits RVP and RVN during transmission is set to a resistance value that is smaller than that during reception, and therefore the resistance value of the terminating resistor circuits RVP and RVN does not decrease in reception. Accordingly, the amplitude of the transmission signal can be secured during reception (when the transmitting circuit of the communication partner transmits a signal through current-driving), and the waveform of the transmission signal does not overlap the inhibited region AR1. As described above, in the present embodiment, the signal quality of the transmission signal can be improved during transmission and reception.

2. Detailed Exemplary Configuration

Figure 3:
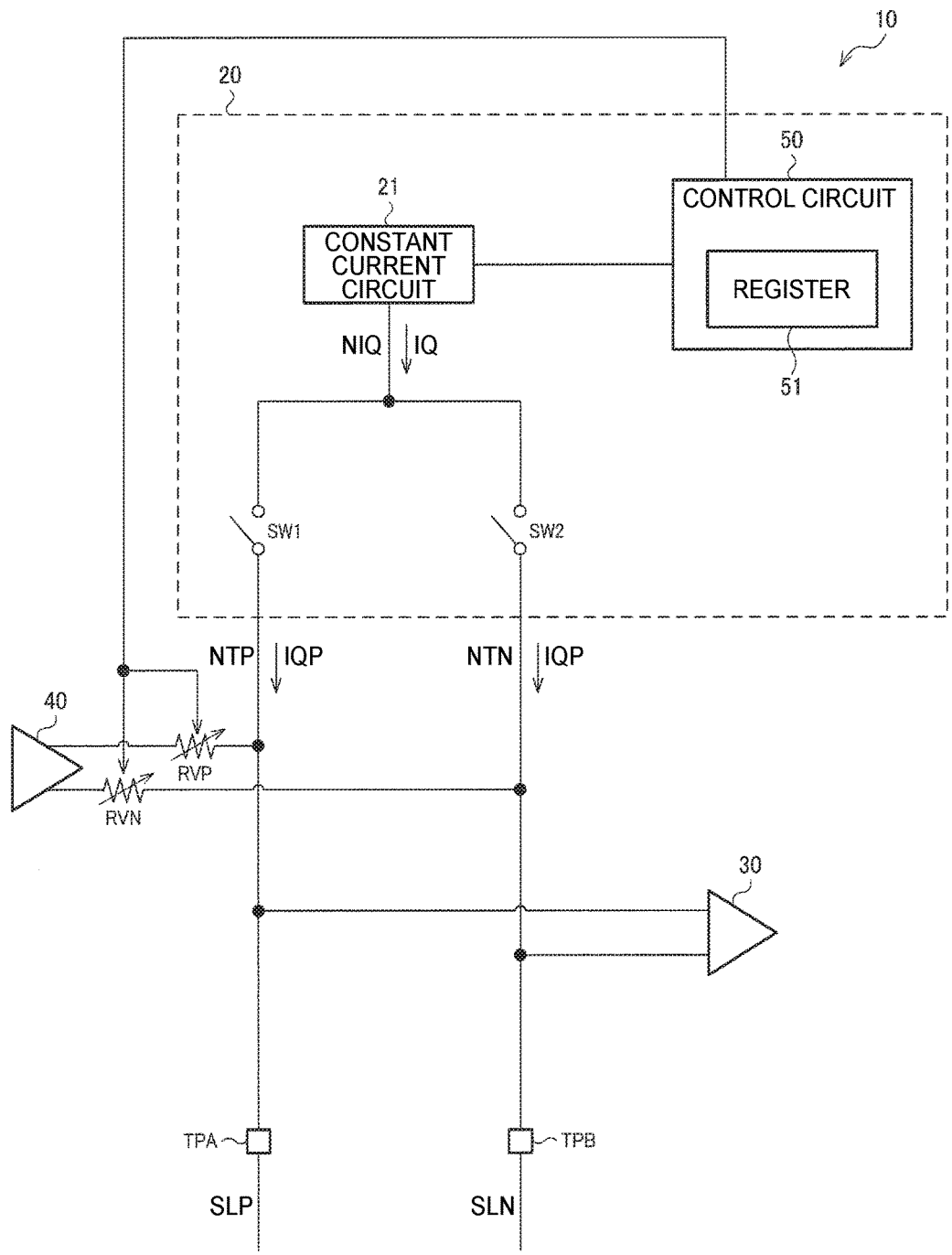
FIG. 3 is a detailed exemplary configuration of the circuit device of the present embodiment.

FIG. 3 is a detailed exemplary configuration of the circuit device of the present embodiment. The circuit device 10 in FIG. 3 includes the HS transmitting circuit 20, an FS transmitting circuit 40, the receiving circuit 30, a control circuit 50, a resistance control circuit 60, and the signal terminals TPA and TNA.

The transmitting circuit 20 includes a constant current circuit 21 that supplies a constant current to the signal lines SLP and SLN, and the control circuit 50 that variably controls the current value of the constant current supplied by the constant current circuit 21. The control circuit 50 adjusts the constant current supplied by the constant current circuit 21 to a current value in accordance with the resistance value of the terminating resistor circuits RVP and RVN.

Specifically, the constant current circuit 21 outputs a constant current IQ whose current value is set by the control circuit 50 to a node NIQ. That is, the constant current circuit 21, when the current value is set by the control circuit 50, outputs a constant current having the set current value until the setting is changed, and when the setting of the current value is changed, outputs a constant current having the set current value. During transmission in the HS mode, the constant current IQ is output to the output nodes NTP and NTN of the transmitting circuit 20 as currents IQP and IQN, respectively, via later-described switch elements SW1 and SW2. The currents IQP and IQN each branch into two currents, currents on one side respectively flow to the terminating resistor circuits RVP and RVN, and currents on the other side respectively flow to the terminating resistors RP and RN of the external device 100 via the signal lines SLP and SLN.

The control circuit 50 sets one of a plurality of settable combinations of resistance values and current values, during transmission in the HS mode, and outputs the setting information to the terminating resistor circuits RVP and RVN and the constant current circuit 21. Also, the control circuit 50 sets a given resistance value (resistance value defined in the USB standard, for example) during transmission and reception in the FS mode, and outputs the setting information to the terminating resistor circuits RVP and RVN. The terminating resistor circuits RVP and RVN are set to the resistance value designated in the setting information. Also, the constant current circuit 21 outputs the constant current IQ having a current value designated in the setting information.

For example, the control circuit 50 includes a register 51 into which setting information is written from a processing device external to the circuit device 10, via an unshown interface. The control circuit 50 sets the resistance value and the current value based on the setting information written into the register 51. Alternatively, the circuit device 10 includes an unshown nonvolatile memory, the setting information is written into the nonvolatile memory when the circuit device 10 is manufactured or the like, and the control circuit 50 may set the resistance value and the current value based on the setting information written into the nonvolatile memory. Note that the control circuit 50 may be configured such that the resistance value of the terminating resistor circuits RVP and RVN and the current value of the constant current IQ output from the constant current circuit 21 are independently controlled.

In the present embodiment, the resistance value of the terminating resistor circuits RVP and RVN is changed between reception and transmission (during HS transmission), and the amplitude of the transmission signal changes according to the resistance value of the terminating resistor circuits RVP and RVN. Therefore, it is possible that the amplitude of the transmission signal (amplitude of a waveform in the eye pattern) during transmission is not an appropriate amplitude. In this regard, according to the present embodiment, the current that the constant current circuit 21 supplies to the signal lines SLP and SLN is adjusted to a current in accordance with the resistance value of the terminating resistor circuits RVP and RVN. Accordingly, the amplitude of the transmission signal can be adjusted so as to be an appropriate amplitude during transmission.

Specifically, the current value of the current to be supplied by the constant current circuit 21 and the resistance value of the terminating resistor circuits RVP and RVN are set such that the signal amplitude SPK is in a range between a minimum amplitude AMIN and a maximum amplitude AMAX in the eye pattern in the USB standard (serial communication standard of signal line), as shown in FIG. 2.

The minimum amplitude AMIN in the eye pattern is a difference between an upper limit and a lower limit of the inhibited region AR1. Also, the maximum amplitude in the eye pattern is a difference between a lower limit of the inhibited region AR2 and an upper limit of the inhibited region AR3. The signal amplitude SPK is a difference between a voltage when the signal transitions to a high level side and a voltage when the signal transitions to a low level side. For example, the signal amplitude SPK is a difference between the maximum voltage when the signal transitions to a high level side and the minimum voltage when the signal transitions to a low level side.

In this way, even in a case where the resistance value of the terminating resistor circuits RVP and RVN is changed between reception and transmission, the quality of the transmission signal during transmission can be improved. Specifically, the resistance value of the terminating resistor circuits RVP and RVN is smaller during transmission than during reception, and therefore the waveform of the transmission signal at rising and falling can be improved. Also, the signal amplitude that decreases due to a reduction in the resistance value can be adjusted so as to be an appropriate amplitude by adjusting the current supplied by the constant current circuit 21. That is, the signal amplitude SPK can be made to be in a range between the minimum amplitude AMIN and the maximum amplitude AMAX in the eye pattern in the USB standard (serial communication standard of signal line).

Figures 4, 5:
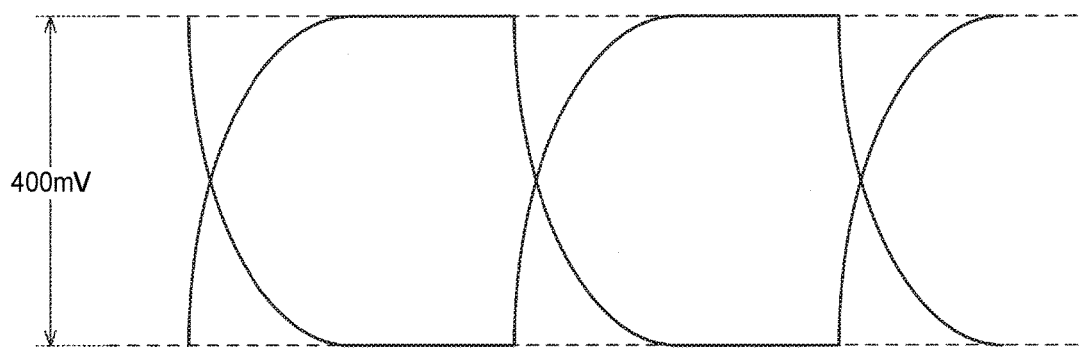
FIG. 4 shows an example of setting values of a resistance value and a current value.
FIG. 5 is an exemplary waveform of a transmission signal with respect to the resistance value and current value corresponding to the condition "During reception".
Figure 6:
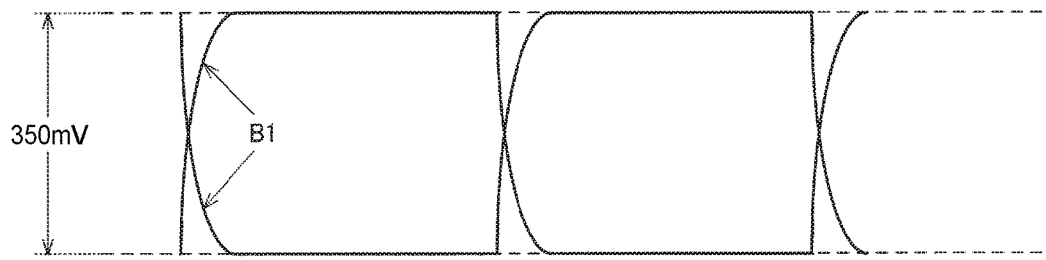
FIG. 6 is an exemplary waveform of the transmission signal with respect to the resistance value and current value corresponding to the condition "Small resistance".
Figure 7:
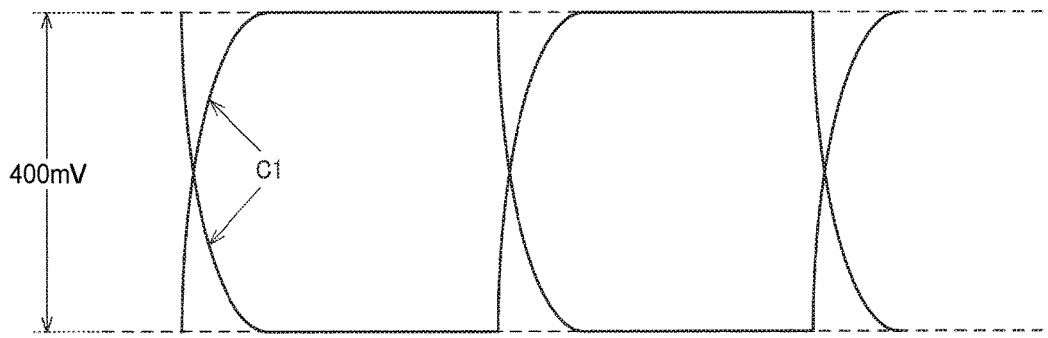
FIG. 7 is an exemplary waveform of the transmission signal with respect to the resistance value and current value corresponding to the condition "Small resistance, large current".

FIG. 4 shows an example of the setting values of the resistance value and the current value in the above-described adjustment. FIGS. 5 to 7 are exemplary waveforms of the transmission signal in the respective setting values.

As shown in FIG. 4, the row "During reception" is an example of the setting values when the circuit device 10 receives a signal from the external device 100. In this condition "During reception", the resistance value of the terminating resistor circuits RVP and RVN of the circuit device 10 is set to 45Ω. At this time, the external device 100 outputs the transmission signal, the resistance value of the terminating resistors RP and RN of the external device 100 is 45Ω, and the current value of the current output by the constant current circuit of the external device 100 is 17.8 mA. The amplitude of the transmission signal is ((45×45)/(45+45)) Ω×17.8 mA=400 mV, as shown in FIG. 5. 400 mV corresponds to the central value of the amplitude range that satisfies the USB standard.

As shown in FIG. 4, the row "Small resistance" is an example of the setting values in the case where, when the circuit device 10 transmits a signal to the external device 100, the resistance value of the terminating resistor circuit is changed with reference to the setting values in the condition "During reception". In the condition "Small resistance", the resistance value of the terminating resistor circuits RVP and RVN of the circuit device 10 is set to 35Ω (<45Ω), and the constant current IQ of the constant current circuit 21 is set to 17.8 mA (the same as the current value 17.8 mA of the constant current circuit of the external device). As a result of reducing the resistance value of the terminating resistor circuits RVP and RVN, the slope of the transmission signal at rising and falling becomes steeper, as shown in B1 in FIG. 6. However, the amplitude of the transmission signal is ((35×45)/(35+45)) Ω×17.8 mA=350 mV, and is smaller than the central value 400 mV in the amplitude range that satisfies the USB standard. When the amplitude of the transmission signal decreases, it is possible that the waveform in the eye pattern will overlap the inhibited region AR1 due to a change (variation) in the waveform in the eye pattern caused by a change in process and temperature.

As shown in FIG. 4, the row "Small resistance, large current" is an example of the setting values in the present embodiment, and is an example of the setting values in the case where, when the circuit device 10 transmits a signal to the external device 100, the resistance value of the terminating resistor circuit and the current value of the current output from the constant current circuit are changed with reference to the setting values in the condition "During reception". In the condition "Small resistance, large current", the resistance value of the terminating resistor circuits RVP and RVN of the circuit device 10 is set to 35Ω (<45Ω), and the constant current IQ of the constant current circuit 21 is set to 20.3 mA (>17.8 mA). As a result of reducing the resistance value of the terminating resistor circuits RVP and RVN, the slope of the transmission signal at rising and falling becomes steeper, as shown in C1 in FIG. 7. Furthermore, the amplitude of the transmission signal is ((35×45)/(35+45)) Ω×20.3 mA=400 mV, which corresponds to the central value in the amplitude range that satisfies the USB standard.

As described above, in the present embodiment, during transmission in the HS mode, the resistance value of the terminating resistor circuits RVP and RVN and the current value of the current output from the constant current circuit 21 are adjusted, and as a result, a transmission signal that can pass the certification test of the USB standard with respect to the eye pattern can be output. Meanwhile, during reception, the communication partner outputs the drive current, which cannot be controlled from the circuit device 10 side. Therefore, as a result of setting the resistance value of the terminating resistor circuits RVP and RVN to the resistance value (45Ω) conforming to the USB standard, the amplitude of the waveform in the eye pattern can be secured.

Also, in the present embodiment, as shown in FIG. 3, the transmitting circuit 20 transmits a signal by current-driving the first and second signal lines SLP and SLN that constitute the differential signal line. The receiving circuit 30 receives a signal that the transmitting circuit 120 of the communication partner (external device 100) has transmitted by current-driving the first and second signal lines SLP and SLN. The first terminating resistor circuit RVP to be connected to the first signal line SLP and the second terminating resistor circuit RVN to be connected to the second signal line SLN are provided as the terminating resistor circuit. Also, the first and second terminating resistor circuits RVP and RVN can be set such that the resistance value in the transmission period (during transmission in which the transmitting circuit 20 performs transmission) is smaller than the resistance value in the reception period (during reception in which the receiving circuit 30 performs reception).

In this way, the present embodiment can be applied to differential serial communication such as that of the USB. Also, as a result of changing the resistance value of the first terminating resistor circuit RVP to be connected to the first signal line SLP and the second terminating resistor circuit RVN to be connected to the second signal line SLN between reception and transmission, an appropriate eye pattern can be realized. Note that, specifically, the resistance value of the first terminating resistor circuit RVP can be set to a resistance value that is smaller during transmission than during reception, and the resistance value of the second terminating resistor circuit RVN can be set to a resistance value that is smaller during transmission than during reception. Here, it is desirable that the resistance values of the first and second terminating resistor circuits RVP and RVN during transmission are the same, and the resistance values of the first and second terminating resistor circuits RVP and RVN during reception are the same. Note that a configuration may be adopted in which the resistance values of the first and second terminating resistor circuits RVP and RVN can be set to different resistance values.

Also, in the present embodiment, the first signal terminal TPA is for connection to the first signal line SLP, and the second signal terminal TNA is for connection to the second signal line SLN. The constant current circuit 21 is a circuit that supplies a current to the first and second signal lines SLP and SLN. The first switch element SW1 is provided between the first signal terminal TPA and the output node NIQ of the constant current circuit 21. The second switch element SW2 is provided between the second signal terminal TNA and the output node NIQ of the constant current circuit 21.

Specifically, in the case of driving the first signal line SLP, the first switch element SW1 is turned on and the second switch element SW2 is turned off, and the constant current IQ from the constant current circuit 21 is output to the node NTP (node connected to the first signal terminal TPA) as the current IQP. On the other hand, in the case of driving the second signal line SLN, the first switch element SW1 is turned off and the second switch element SW2 is turned on, and the constant current IQ from the constant current circuit 21 is output to the node NTN (node connected to the second signal terminal TNA) as the current IQN.

In this way, differential current-driving can be performed with the current supplied by the constant current circuit 21. Also, in the present embodiment, the current supplied by the constant current circuit 21 and the resistance value of the first and second terminating resistor circuits RVP and RVN are changed between reception and transmission, and as a result, an appropriate eye pattern can be realized with respect to the differential transmission signal.

Also, in the present embodiment, the second transmitting circuit 40 transmits a signal by voltage-driving the first and second signal lines SLP and SLN. In the first communication mode of the USB standard (serial communication standard of the signal lines SLP and SLN), the transmitting circuit 20 (first transmitting circuit) performs transmission, and the second transmitting circuit 40 outputs a low potential side power supply voltage (ground, for example), and in the second communication mode of the USB standard, the second transmitting circuit 40 performs transmission. The second communication mode is a communication mode in which the data transfer rate is low relative to the first communication mode. The first terminating resistor circuit RVP is provided between the first signal terminal TPA and a first output node of the second transmitting circuit 40. The second terminating resistor circuit RVN is provided between the second signal terminal TPB and a second output node of the second transmitting circuit 40.

Specifically, in the first communication mode, as a result of controlling on and off of the switch elements SW1 and SW2, the transmitting circuit 20 outputs a differential transmission signal to the signal lines SLP and SLN. On the other hand, in the second communication mode, the switch elements SW1 and SW2 are turned off, the second transmitting circuit 40 outputs a differential voltage to the signal lines SLP and SLN, and as a result, a differential transmission signal is output to the signal lines SLP and SLN.

In this way, the resistors provided at the output nodes of the second transmitting circuit 40 that transmits a signal in the second communication mode, can also be used as the terminating resistor circuit used in the first communication mode. Passing the certification test with respect to the eye pattern, in the first communication mode in which the data transfer rate is higher, is difficult relative to the second communication mode, but in the present embodiment, as a result of changing the resistance value of the terminating resistor circuit between reception and transmission, in the first communication mode, eye pattern characteristics can be improved.

Also, in the present embodiment, the resistance value of the terminating resistor circuits RVP and RVN is set to a resistance value that satisfies the USB standard (serial communication standard of the signal lines SLP and SLN) in the reception period (during reception).

The reception period is a period in which the receiving circuit 30 receives a signal in the first and second communication modes. Note that, in the present embodiment, in the transmission period in the second communication mode as well, the resistance value of the terminating resistor circuits RVP and RVN is set to a resistance value that satisfies the USB standard (serial communication standard of the signal lines SLP and SLN).

During reception, the communication partner transmits a transmission signal, and therefore the circuit device 10 is unaware of what type of signal the communication partner will transmit (the circuit device 10 cannot control the parameters of the transmitting circuit on the communication partner side). Therefore, during reception, it is desirable that the parameters relating to reception are set to parameters that satisfy the USB standard (serial communication standard of the signal lines SLP and SLN). In the present embodiment, the resistance value of the terminating resistor circuits RVP and RVN is adjustable, and the resistance value is set to a resistance value that satisfies the USB standard during reception, and as a result, the transmission signal from the communication partner can be properly received.

Also, in the present embodiment, the control circuit 50 sets the resistance value of the terminating resistor circuits RVP and RVN in the transmission period (during transmission) to one of a plurality of resistance values.

Note that the control circuit (setting circuit) that sets the current value of the constant current IQ output by the constant current circuit 21 and the control circuit (setting circuit) that sets the resistance value of the terminating resistor circuits RVP and RVN may be provided as separate circuits.

In this way, as a result of selecting one of the plurality of resistance values during transmission, the resistance value of the terminating resistor circuits RVP and RVN can be changed between reception and transmission. For example, a given resistance value is selected out of the plurality of resistance values during reception, and one of the plurality of resistance values is selected during transmission. Note that a configuration may be adopted in which the same resistance value (given resistance value) can be selected during reception and transmission. That is, it is sufficient that resistance values that are different between reception and transmission can be selected.

Also, in the present embodiment, the signal lines SLP and SLN are signal lines conforming to the USB standard. The transmitting circuit 20 performs transmission in the HS mode, and the second transmitting circuit 40 performs transmission in the FS mode. In the HS mode, with respect to the resistance value of the terminating resistor circuits RVP and RVN, the resistance value in the transmission period can be set to a resistance value that is smaller than that in the reception period.

The HS mode corresponds to the first communication mode described above, and the FS mode corresponds to the second communication mode described above. Note that the invention is applicable, not only to the USB standard, but also to a serial communication standard in which a signal line is current-driven, and the first and second communication mode are not limited to the HS and FS modes.

In the HS mode, the data transfer rate is higher than that in the FS mode, and therefore passing the certification test with respect to the eye pattern is difficult relative to the FS mode. In this regard, in the present embodiment, as a result of changing the resistance value of the terminating resistor circuit, in the HS mode, between reception and transmission, eye pattern characteristics in the HS mode can be improved.

3. Terminating Resistor Circuit and Constant Current Circuit

Figure 8:
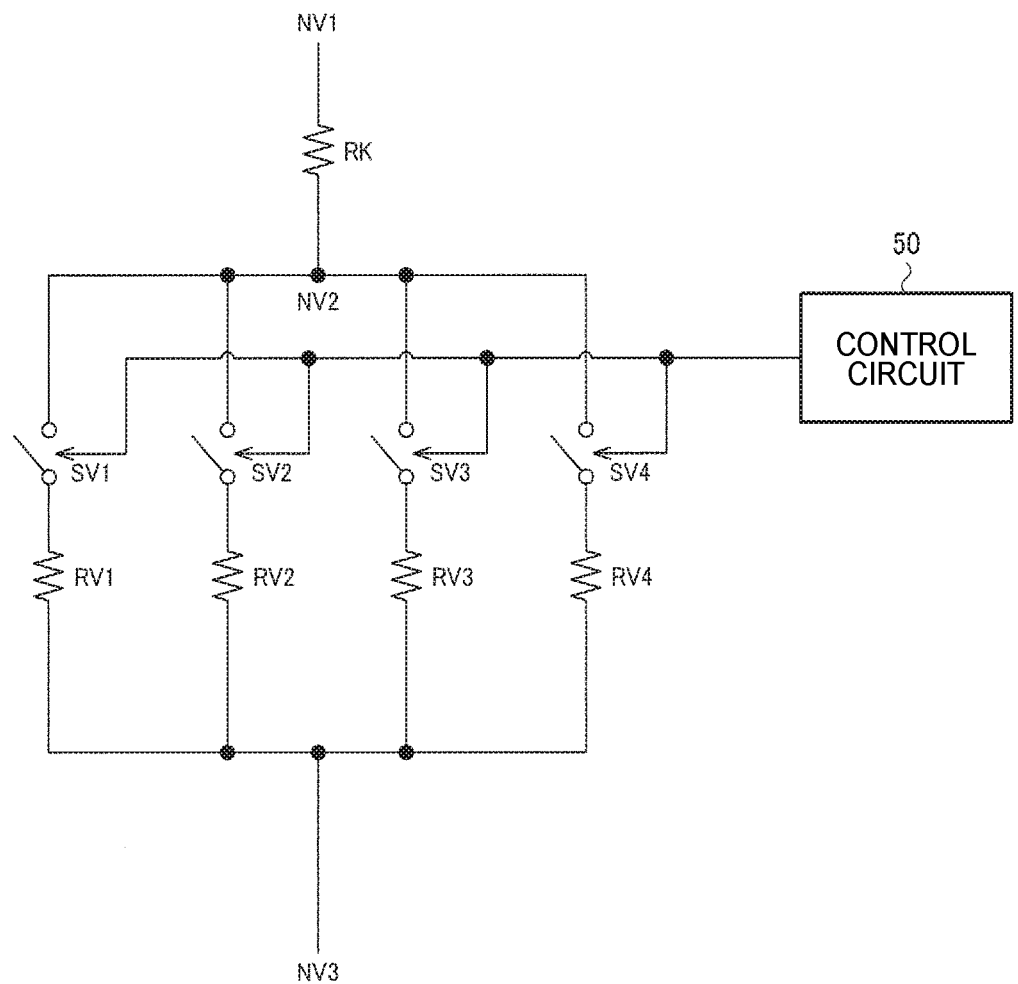
FIG. 8 is a detailed exemplary configuration of a terminating resistor circuit.

FIG. 8 is a detailed exemplary configuration of the terminating resistor circuit (RVP, RVN). The terminating resistor circuit in FIG. 8 includes a resistor RK provided between a node NV1 and a node NV2, switch elements SV1 to SV4, and resistors RV1 to RV4 that are provided between the node NV2 and a node NV3.

The switch element SV1 and the resistor RV1 are connected in series, the switch element SV2 and the resistor RV2 are connected in series, the switch element SV3 and the resistor RV3 are connected in series, and the switch element SV4 and the resistor RV4 are connected in series. Also, these are connected in parallel between the node NV2 and the node NV3. The switch elements SV1 to SV4 are each constituted by a MOS transistor, for example, and are each a transfer gate, for example. Turning on and off of the switch elements SV1 to SV4 is controlled by the control circuit 50. For example, during reception, the switch element SV1 is turned on, and the switch elements SV2 to SV4 are turned off. During transmission, the switch element SV1 is turned off, and one of the switch elements SV2 to SV4 is turned on. Which of the switch elements is turned on is controlled in accordance with setting information written into the register 51 in FIG. 3, for example. The resistance value of at least one resistor out of the resistors RV2 to RV4 is a resistance value that is smaller than the resistance value of the resistor RV1. The resistors RV2 to RV4 may include a resistor whose resistance value is larger than that of the resistor RV1.

Figure 9:
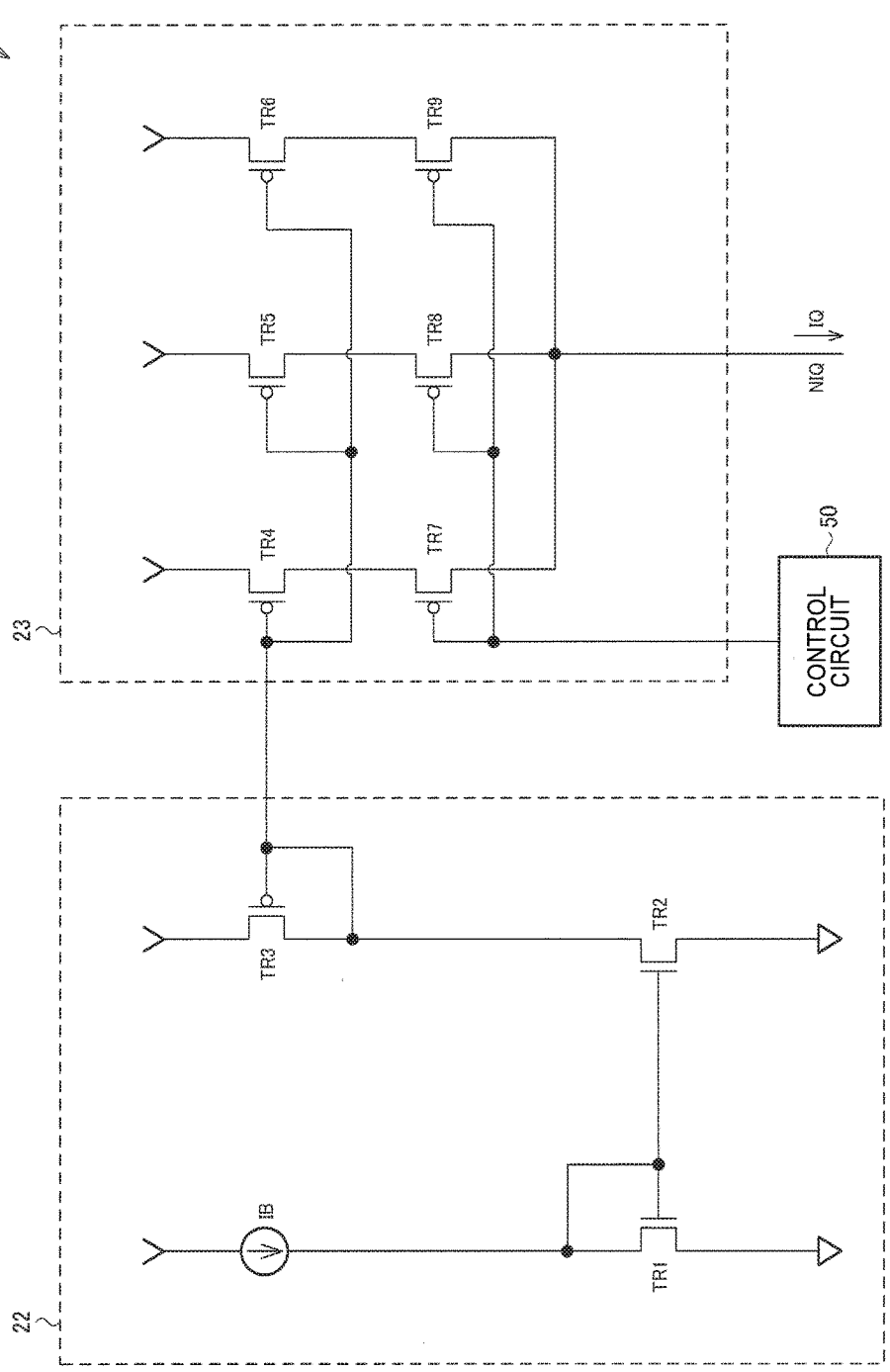
FIG. 9 is a detailed exemplary configuration of a constant current circuit.

FIG. 9 is a detailed exemplary configuration of the constant current circuit. The constant current circuit 21 in FIG. 9 includes a bias generator 22 and a current output unit 23.

The bias generator 22 includes a current source IB, N-type MOS transistors TR1 and TR2, and a P-type MOS transistor TR3. The transistor TR2 is connected to the transistor TR1 so as to form a current mirror circuit, the current flowing from the current source IB to the transistor TR1 is mirrored to the current flowing through the transistor TR2, and the mirrored current flows through the transistor TR3.

The current output unit 23 includes P-type MOS transistors RT4 to TR9. The transistors TR4 to TR6 are connected to the transistor TR3 in the bias generator 22 so as to form a current mirror circuit, and the current flowing through the transistor TR3 is mirrored to the currents flowing through the respective transistors TR4 to TR6. For example, the transistors TR4 to TR6 have different sizes so as to have different mirror ratios (currents flowing due to current mirror function). Turning on and off of the transistors TR7 to TR9 is controlled by the control circuit 50. For example, one or multiple transistors out of the transistors TR7 to TR9 are turned on. For example, when the transistors TR7 and TR8 are turned on, the sum of currents flowing through the transistors TR4 and TR5 are output to the node NIQ as the constant current IQ.

The current value that is selectable in this way is a current value that corresponds to the resistance value of the terminating resistor circuits RVP and RVN. That is, the current value of the constant current IQ and the resistance value of the terminating resistor circuits RVP and RVN can be set such that the amplitude of the transmission signal satisfies the USB standard (so as to be 400 mV, for example). Note that, because the amplitude of the transmission signal changes influenced by the parasitic resistance of the signal lines SLP and SLN and the like, a configuration may be adopted in which the current value of the constant current IQ and the resistance value of the terminating resistor circuits RVP and RVN can be independently set. In this case, the current value of the constant current IQ and the resistance value of the terminating resistor circuits RVP and RVN are independently set in the register 51.

4. Modifications

Figure 10:
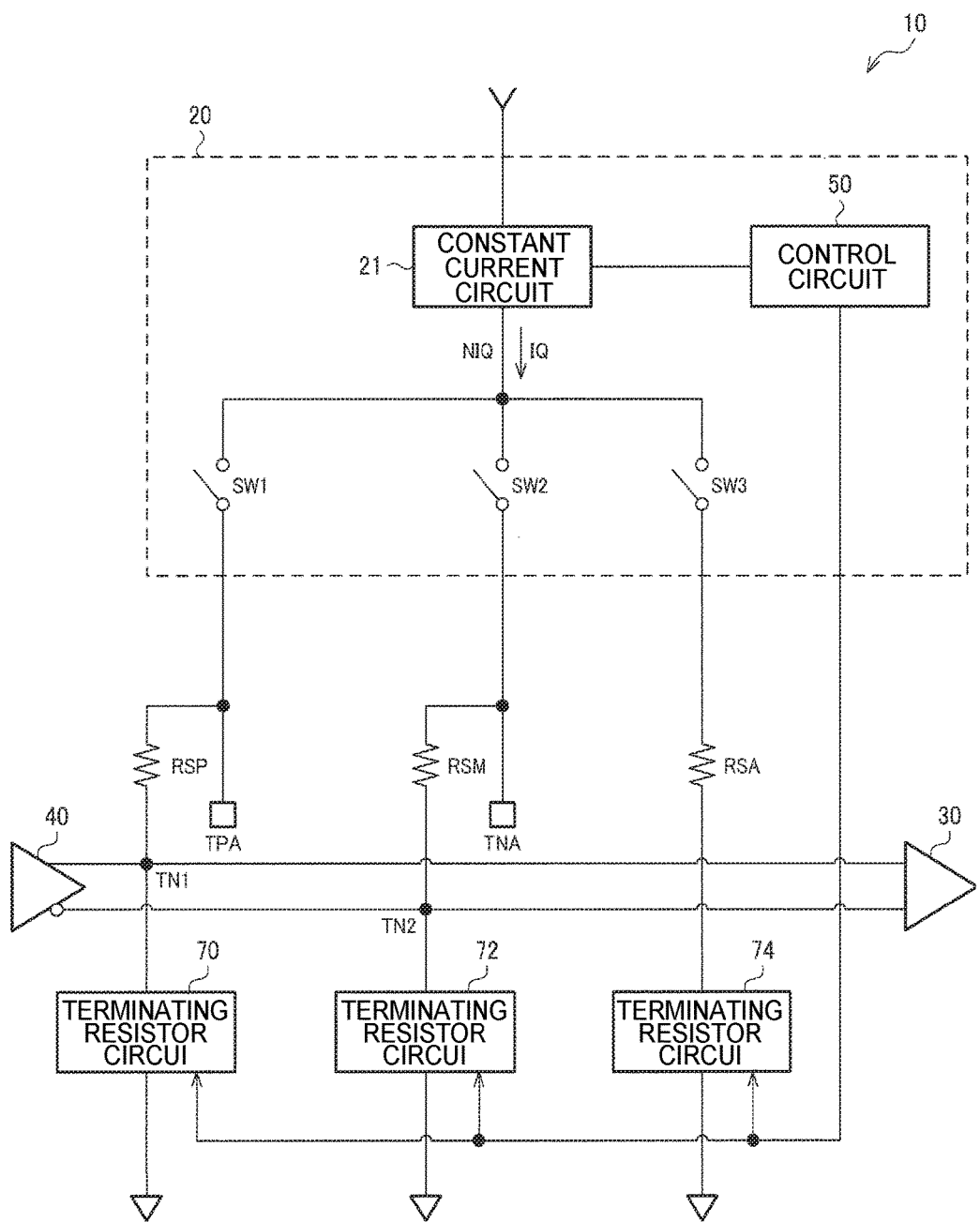
FIG. 10 shows a modification of the circuit device.

FIG. 10 shows a modification of the circuit device. In FIG. 10, the physical layer circuit is illustrated, and the illustration of the processing circuit is omitted. The circuit device 10 in FIG. 10 includes the HS mode transmitting circuit 20, the FS mode transmitting circuit 40, the receiving circuit 30, terminating resistor circuits 70, 72, and 74

(variable resistance circuits), resistors RSP, RSM, and RSA, and the signal terminals TPA and TNA. Note that the constituent elements that are the same as the constituent elements that have been described will be denoted by the same reference signs, and the description thereof will be omitted, as appropriate.

The transmitting circuit 20 includes the constant current circuit 21, switch elements SW1 to SW3, and the control circuit 50. The switch element SW3 is turned on when both of the switch elements SW1 and SW2 are turned off, and allows a constant current IQ from the constant current circuit 21 to flow to the resistor RSA and the terminating resistor circuit 74. Accordingly, while the constant current circuit 21 outputs the constant current IQ, a current flows through any of the switch elements SW1 to SW3, the current path does not disappear, and therefore the constant current IQ output from the constant current circuit 21 can be stabilized.

During transmission in the HS mode, the resistor RSP and the terminating resistor circuit 70 function as the terminating resistor of the signal line SLP, and the resistor RSM and the terminating resistor circuit 72 function as the terminating resistor of the signal line SLN. At this time, the output of the transmitting circuit 40 is in a high impedance state, for example. During reception, the voltage at a node TN1 between the resistor RSP and the terminating resistor circuit 70 and the voltage at a node TN2 between the resistor RSM and the terminating resistor circuit 72 are input to the receiving circuit 30. Also, the control circuit 50 is configured to set the resistance value of the terminating resistor circuits 70 and 72 during reception to a resistance value that is different from the resistance value during transmission in the HS mode.

In the FS mode, the terminating resistor circuits 70 and 72 are each set in a high impedance state, for example, and transmission and reception through voltage-driving are performed via the resistors RSP and RSM.

5. Electronic Apparatus

Figure 11:
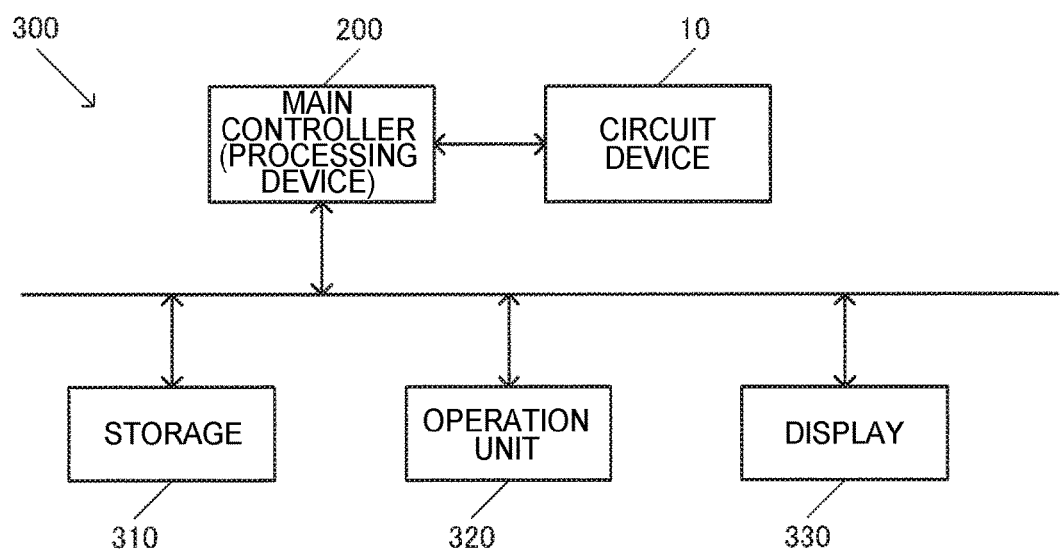
FIG. 11 is an exemplary configuration of an electronic apparatus.

FIG. 11 is an exemplary configuration of an electronic apparatus including the circuit device of the present embodiment. This electronic apparatus 300 includes the circuit device 10 of the present embodiment, and a main controller 200 (processing device). The main controller 200 and the circuit device 10 are connected via a bus conforming to the USB standard (serial communication standard). In the example in FIG. 11, the circuit device 10 corresponds to a peripheral device. A mobile terminal device or the like can be envisioned as the peripheral device, for example, but there is no limitation to this. The peripheral device may be a wearable apparatus.

The main controller 200 is realized by a processor such as a CPU or an MPU. Alternatively, the main controller 200 may be realized by various ASIC circuit devices. Moreover, the main controller 200 may be realized by a circuit board on which a plurality of circuit devices (ICs) and circuit components are mounted.

The electronic apparatus 300 can further include a storage 310, an operation unit 320, and a display 330. The storage 310 is for storing data, and the functionality thereof can be realized by a semiconductor memory such as a RAM or a ROM, an HDD (Hard Disk Drive), or the like. The operation unit 320 enables a user to perform input operations, and can be realized by operation devices such as operation buttons or a touch panel display. The displayer 330 is for displaying various types of information, and can be realized by a display such as a liquid crystal display or an organic EL display. Note that in the case of using a touch panel display as the operation unit 320, this touch panel display can realize the functionality of both the operation unit 320 and the display 330.

Various types of apparatuses can be envisioned as the electronic apparatus 300 realized by the present embodiment, examples of which include an on-board apparatus, a printing device, a projecting device, a robot, a head-mounted display device, a biological information measurement apparatus, a measurement apparatus for measuring a physical quantity such as distance, time, flow speed, or flow rate, a network-related apparatus such as a base station or a router, a content providing apparatus that distributes content, and a video apparatus such as a digital camera or a video camera.

Note that, in FIG. 11, a case where the method of the invention is applied to a peripheral device has been described as an example, but the application of the invention is not limited thereto. For example, the method of the invention may be applied to a main controller. Alternatively, the method may be applied to a USB hub connected to a main controller via a bus. In this case, a peripheral device is connected to the USB hub via a bus. The method of the invention may be applied to both an upstream port and a downstream port of the USB hub, or applied to one of the upstream port and the downstream port.

Note that although an embodiment has been described in detail above, a person skilled in the art will readily appreciate that it is possible to implement numerous variations and modifications that do not depart substantially from the novel aspects and effects of the invention. Accordingly, all such variations and modifications are also to be included within the scope of the invention. For example, terms that are used within the description or drawings at least once together with broader terms or alternative synonymous terms can be replaced by those other terms at other locations as well within the description or drawings. Also, all combinations of the embodiment and variations are also encompassed in the range of the invention. Moreover, the configuration, operations, and the like of the circuit device, the external device, and the electronic apparatus are not limited to those described in the embodiment, and various modifications can be implemented.

This application claims priority from Japanese Patent Application No. 2017-107490 filed in the Japanese Patent Office on May 31, 2017, the entire disclosure of which is hereby incorporated by reference in its entirely.

What is claimed is:

1. A circuit device comprising:
    a terminating resistor circuit connected to a signal line;
    a transmitting circuit that transmits a signal by current-driving the signal line in a transmission period, the transmitting circuit including:
        a current source that supplies a constant current to the signal line; and
        a control circuit that sets a current value of the constant current supplied by the current source to a current value in accordance with a resistance value of the terminating resistor circuit; and
    a receiving circuit that receives a signal that a transmitting circuit of a communication partner has transmitted by current-driving the signal line, in a reception period that is different from the transmission period,
    wherein the resistance value of the terminating resistor circuit in the transmission period is set to a value that is smaller than the resistance value of the terminating resistor circuit in the reception period.

2. The circuit device according to claim 1, wherein the current value of the constant current supplied by the current source and the resistance value of the terminating resistor circuit are set such that a signal amplitude is in a range between a minimum amplitude and a maximum amplitude, in an eye pattern, that are defined in a serial communication standard of the signal line.

3. The circuit device according to claim 1, wherein the resistance value of the terminating resistor circuit is set to satisfy a serial communication standard of the signal line, in the reception period.

4. The circuit device according to claim 1, wherein the signal line conforms to a USB standard.

5. An electronic apparatus comprising the circuit device according to claim 1.

6. A circuit device comprising:
a transmitting circuit that transmits a signal by current-driving a first signal line and a second signal line, which constitute a differential signal line;
a receiving circuit that receives a signal that has been transmitted by a transmitting circuit of a communication partner current-driving the first signal line and the second signal line;
a first terminating resistor circuit connected to the first signal line; and
a second terminating resistor circuit connected to the second signal line,
wherein the first terminating resistor circuit and the second terminating resistor circuit are set to have a resistance value such that the resistance value in the transmission period is smaller than the resistance value in the reception period.

7. The circuit device according to claim 6, further comprising:
a first signal terminal for connection to the first signal line; and
a second signal terminal for connection to the second signal line,
wherein the transmitting circuit includes:
a current source that supplies a constant current to the first signal line and the second signal line;
a first switch element provided between the first signal terminal and an output node of the current source; and
a second switch element provided between the second signal terminal and the output node of the current source.

8. The circuit device according to claim 7, further comprising:
a second transmitting circuit that performs transmission of a signal by voltage-driving the first signal line and the second signal line,
wherein, in a first communication mode of a serial communication standard of the differential signal line, the transmitting circuit performs the transmission and the second transmitting circuit outputs a low potential side power supply voltage, and in a second communication mode of the serial communication standard, in which a data transfer rate is slower than that in the first communication mode, the second transmitting circuit performs the transmission,
the first terminating resistor circuit is provided between the first signal terminal and a first output node of the second transmitting circuit, and
the second terminating resistor circuit is provided between the second signal terminal and a second output node of the second transmitting circuit.

9. The circuit device according to claim 6, further comprising:
a control circuit that sets the resistance value, of the first and second terminating resistor circuits in the transmission period, to one of a plurality of resistance values.

10. The circuit device according to claim 6, wherein the resistance value of the first and second terminating resistor circuits is set to a resistance value that satisfies a serial communication standard of the differential signal line, in the reception period.

11. The circuit device according to claim 6, wherein the differential signal line conforms to a USB standard.

12. An electronic apparatus comprising the circuit device according to claim 6.

13. A circuit device comprising:
a signal line conforming to a USB standard;
a transmitting circuit that performs transmission of a signal by current-driving the signal line in a transmission period;
a receiving circuit that receives a signal that a transmitting circuit of a communication partner has transmitted by current-driving the signal line, in a reception period that is different from the transmission period;
a terminating resistor circuit connected to the signal line; and
a second transmitting circuit that performs transmission of a signal by voltage-driving the signal line,
wherein the transmitting circuit performs transmission in High Speed mode, and the second transmitting circuit performs transmission in a Full Speed mode, and
the terminating resistor circuit is set to have a resistance value in the transmission period that is smaller than a resistance value in the reception period, in the High Speed mode.

14. An electronic apparatus comprising the circuit device according to claim 13.

* * * * *